United States Patent [19]
Russell et al.

[11] Patent Number: 5,991,184
[45] Date of Patent: Nov. 23, 1999

[54] VEHICULAR EXTENDED THERMAL CYCLE MINIMAL PART ROBUST RECTIFIER ASSEMBLY

[75] Inventors: John W. Russell, Orlando; Robin D. Rice, Altamonte Springs, both of Fla.

[73] Assignee: Transpo Electronics, Inc., Orlando, Fla.

[21] Appl. No.: 09/261,089

[22] Filed: Mar. 2, 1999

[51] Int. Cl.⁶ .......................... H02M 1/00; H02K 11/00
[52] U.S. Cl. ........................................... 363/145; 310/680
[58] Field of Search ..................... 363/141, 144, 363/145; 310/68 D, 64

[56] References Cited

U.S. PATENT DOCUMENTS

| | | | |
|---|---|---|---|
| 3,629,631 | 12/1971 | Cotton et al. | 310/68 D |
| 3,641,374 | 2/1972 | Sato | 310/68 D |
| 3,812,390 | 5/1974 | Richards | 310/68 D |
| 3,927,338 | 12/1975 | Vieilleribiere | 310/68 D |
| 3,959,676 | 5/1976 | Striker | 310/68 D |
| 4,189,653 | 2/1980 | Hiratuka et al. | 310/68 D |
| 4,419,597 | 12/1983 | Shiga et al. | 310/68 D |
| 4,604,538 | 8/1986 | Merrill et al. | 310/68 D |
| 4,606,000 | 8/1986 | Steele et al. | 363/145 |
| 4,952,829 | 8/1990 | Armbruster et al. | 310/68 D |
| 5,043,614 | 8/1991 | Yockey | 310/68 D |
| 5,331,231 | 7/1994 | Koplin et al. | 310/68 D |
| 5,451,823 | 9/1995 | Deverall et al. | 310/68 D |
| 5,453,648 | 9/1995 | Bradfield | 363/145 X |
| 5,646,838 | 7/1997 | Keider et al. | 310/68 D |
| 5,659,212 | 8/1997 | DePetris | 310/68 D |
| 5,812,388 | 9/1998 | Keider et al. | 363/145 |
| 5,838,544 | 11/1998 | Wei | 363/145 X |

*Primary Examiner*—Y. J. Han
*Attorney, Agent, or Firm*—Allen, Dyer, Doppelt, Milbrath & Gilchrist, P.A.

[57] ABSTRACT

A rectifier includes a first electrically conductive cooling member having a first surface for direct contact mounting. A second surface has a first set of diode mounting locations. A diode is mounted within each diode mounting location of the first set and has a terminal extending generally normal from the first surface. An electrical insulator overlies the second surface. A second electrically conductive cooling member has a first surface overlying the insulator, and a second surface having a second set of diode mounting locations. The second electrically conductive cooling member has a plurality of slot openings formed in a radial pattern and extending through the second electrically conductive cooling member from the first surface to the second surface. Cooling fins extend upward beyond the second surface adjacent the slot openings and have formed radii edges such that a high pressure area is formed on one side of the cooling member and a low pressure area is formed on the other side to create a ram effect of air movement through the slot openings to effect enhanced cooling. A diode is mounted within each diode mounting location of the second set. A preformed lead layer formed as an integument is mounted on the second cooling member.

22 Claims, 5 Drawing Sheets

VEHICULAR EXTENDED THERMAL CYCLE MINIMAL PART ROBUST RECTIFIER ASSEMBLY

FIELD OF THE INVENTION

This invention is related to rectifier assemblies for engine-driven alternating current generators that have extended thermal cycling.

BACKGROUND OF THE INVENTION

Rectifier assemblies are often mounted on generators and should have high resistance to corrosion. These rectifiers also should reliably recover from short overloading conditions, have a minimum component count, be quickly and easily assembled either manually or with semi-automated production equipment, be economical to manufacture, and withstand mechanical stress with minimum sacrifice of thermo-conductivity. The rectifier assemblies should also provide an output current in a very direct manner, thus minimizing the number of interconnections.

Prior art rectifier assemblies have been designed with different needs in mind. In U.S. Pat. No. 4,606,000 to Steels et al.,embedded preformed leads are positioned in a wedge block configuration, and inserted in a dovetail receptacle that is extruded into an aluminum cooling member. It connects the polyphase stators leads to header sandwiched chip diodes by solder. It has become well known that these soldered connections will fatigue over time because of repeated thermal cycling. Short overloading conditions resulting in excessive diode heat will exceed the melting temperature of the solder, rendering the connection useless or, at the minimum, resulting in a high resistive connection exacerbating diode failure.

In U.S. Pat. No. 5,696,212 to DePetris, the key diode contact points are spring loaded with the assumption that the solder will melt and return to its original form. While this may prevent an immediate catastrophic failure, it is well known that the repeated melting and cooling of solder fatigues the metal, resulting in the formation of air bubbles with the familiar frosted appearance. This results in an increased contact resistance augmenting the gross diode-junction heat dissipation. This device also has a number of additional components, adding to the complexity of the design. In this patent, a solid phenolic gasket material has greater crush proof resistance, and contributes to a greater thermal resistance between the positive cooling member and the negative thermal conductive plate. Thus, this device requires a greater dependence on the forced air cooling requirements of the positive cooling member, resulting in additional isolated cooling fins and increased manufacturing costs.

In U.S. Pat. Nos. 4,646,838 and 5,812,388 to Keidar et al., a positive heat cooling member of a rectifier assembly is disclosed. Details of the type of diode used, how the diode is connected, and the thermo-conductive aspects of the rectifier are ignored. Keidar in U.S. Pat. No. 5,646,838 has added slots to the gasket contact area surface of the positive cooling member in an attempt to increase air flow under the cooling member. As the major direction of the air flow is perpendicular to these slots, only a minor difference in air pressure exists across these slots resulting in minimum air flow. Keidar's added slots to the positive cooling member lessens the thermo-conductivity area offsetting to a degree his claimed advantages of adding the slots.

U.S. Pat. No. 5,812,388, Keidar et al. embellishes said U.S. Pat. No. 5,646,838 by adding a serrated surface on a plan surface opposite to the gasket surface in the positive cooling member. It is well known in the art that any attempt to increase surface area of a forced air cooling member will aid in heat dissipation of the member. Keidar's placement of the serrated planar surface is positioned in such a manner to be perpendicular to the majority of air flow in the generator assembly, thus minimizing any advantageous effects. If the serrations were added to the through slots located between the fins of the cooling member or to the outer periphery of the cooling member, some benefit may be gained as the added area would be parallel to the majority of air flow in the generator configuration. The manufacturing cost of adding such serrations becomes highly debatable as to their cost effectiveness.

U.S. Pat. No. 4,606,000 to Steele, et al. shows a through hole in the positive cooling member for inserting a keyed battery bolt. The bolt contacts the cooling member via a retaining nut. An insulator and generator end-frame is compressed by tightening the nut. The path for current flow originating from the positive cooling member is via contact to the nut, then through the battery bolt. Further compression of the compressed insulator or thermal variations in the generator end frame can lead to the loosening of the nut resulting in a high resistive electrical connection.

U.S. Pat. No. 5,453,648 to Bradfield shows a threaded bolt with a corresponding threaded hole in the positive cooling member, while Bradfield effectively increases the bolt contact area to the positive cooling member. This was accomplished at the cost of eliminating the key locking feature of both the unshown insulator and the keyed hole in the generator end frame. A disadvantage of this method is that vibration or bumping on the battery cable can loosen the threaded bolt into the positive cooling member resulting both in an erratic connection and lack of compression on the positive-negative cooling member that depends on compression to assure electrical conductivity.

U.S. Pat. Nos. 4,952,829 and 5,331,231 to Armbruster et al. and Koplin et al., respectively, assigned to Robert Bosch GmBH, disclose rectifier devices for three-phase generators. These complicated rectifiers do not adequately disclose a good cooling mechanism as desired by intensive generator applications.

SUMMARY OF THE INVENTION

It is therefore an object of the present invention to provide a rectifier that has extended thermal cycling, high heat dissipation ability, high resistance to corrosion, and can reliably recover from short overloading conditions.

It is another object of the present invention to provide a rectifier that has a minimum component count and can be quickly and easily assembled either manually or with semi-automated production equipment.

In the present invention, a rectifier assembly includes a first electrically conductive cooling member having a first surface with direct contact mounting and a second surface having a first set of diode mounting locations. A diode is mounted within each diode mounting location of the first set. Each diode has a terminal extending generally normal from the first surface. An electrical insulator overlies the second surface of the first electrically conductive cooling member. A second electrically conductive cooling member has a first surface overlying the insulator, and a second surface having a second set of diode mounting locations. The electrically conductive cooling member has a plurality of slot openings formed in a radial pattern and extending through the second electrically conductive cooling member from the first surface to the second surface.

A plurality of cooling fins extend upward beyond the second surface of the electrically conductive cooling member adjacent the slot openings. The slot openings and the cooling fins have formed radii edges such that a high pressure area is formed on one side of the cooling member, and a low pressure area is formed on the other side to create a ram effect of air movement through the slot openings to effect enhanced cooling.

A diode is mounted within each diode mounting location of the second set. Each diode has a terminal extending generally normal from the first surface. A preformed lead layer is formed as an integument mounted on the second cooling member and has conductive leads embedded therein that interconnect the diode of the first and second sets. A terminal interconnects with a corresponding lead of a vehicle.

In still another aspect of the present invention, each of the first and second electrically conductive cooling members are arcuately configured forming a curve. The slot openings fan radially outward along lines defined from a center point of the curve. The electrical insulator also comprises an electrical insulating gasket having opposing surfaces formed of high heat conductive silicon embedded fabric. The electrical insulator surface is positioned against the first conductive cooling member and comprises a phenolic layer embedded within a gasket to aid in absorbing stress. The preformed lead layer includes opposing ends, a capacitor cavity formed within one of the ends, and a capacitor mounted within the capacitor cavity and interconnecting with at least one of the conductive leads embedded therein. The capacitor can be adhesively bonded within the capacitor cavity.

The diode mounting locations on the first electrically conductive cooling member are preferably formed as holes passing through the first electrically conductive cooling member and dimensioned to receive diodes of the first set in an interference fit. The second set of diode mounting locations can be formed similar. Both diode sets can be configured as an interference fit. Insulated stand offs can align the preformed lead layer with the second electrically conducted cooling member to aid in rapid assembly.

In the present invention, preformed leads are cast directly into an integument that is fashioned to prevent alteration of key alignment points in a manner consistent with normal handling. The preformed leads are cast in a manner where their electric contact point is permitted to flex to ease mechanical and thermal stress to the diode leads to which they are connected.

The preform leads are designed in such a manner to be directly electro-welded to their respective diodes, thus eliminating the possibility of conventional solder melting or the need to provide mechanical preloading means. Additional preformed leads are cast directly into the integument that are electro-welded to a capacitor. The leads are formed in such a manner to make one capacitor lead conductor connected to a thermo-conductive plate via a standard mounting screw. The other capacitor lead conductor formed in such a manner as to make connection to a cooling member via compression from the standard mounting screw. The integument is formed with a cavity to receive the capacitor in such a manner where the capacitor can be cemented into the integument cavity for a mechanically sound mounting.

The cooling member has a cast metal construction and is constructed in such a manner as to receive a plurality of press-fit diodes. The cooling member is designed to receive precast standoffs in the integument for ease of production assembly and uniform alignment. The cooling member is designed to receive a press-in battery terminal bolt for an air tight corrosion resistant seal. The cooling member is designed with extended aerodynamic type flow fins to maximize forced air movement for maximum convection cooling. The cooling member can be machined flat on a contacting surface to maximize heat transfer via the thermo-conductive means.

An electrical insulating gasket of uniform silicon impregnated fabric allows maximum thermo-conductive heat transfer reinforced with predetermined positioned embedded phenolic at key high mechanical stress regions. The gasket is optimized for maximum thermo-conductivity and resistance to piercing, thus resulting from mechanical stress.

A thermal conductive plate of preferably stamped metal construction is designed to receive a plurality of press-fit diodes. The conductive plate is designed to receive precast standoffs in the integument for ease of production assembly and uniform alignment. The conductive plate is designed to pass a pressed-in battery terminal bolt without electrical conduction.

BRIEF DESCRIPTION OF THE DRAWINGS

Other objects, features and advantages of the present invention will become apparent from the detailed description of the invention which follows, when considered in light of the accompanying drawings in which:

FIGS. 5A and 5B are perspective views of the heat conducting electrical insulating gasket, wherein the top view, FIG. 5A, is as in FIG. 1, and the bottom view, FIG. 5B, is rotated 180 degrees to the right showing the detail of the embedded phenolic ring providing pierce proof regions in areas of high mechanical stress.

DETAILED DESCRIPTION OF THE PREFERRED EMBODIMENTS

Figure 1:
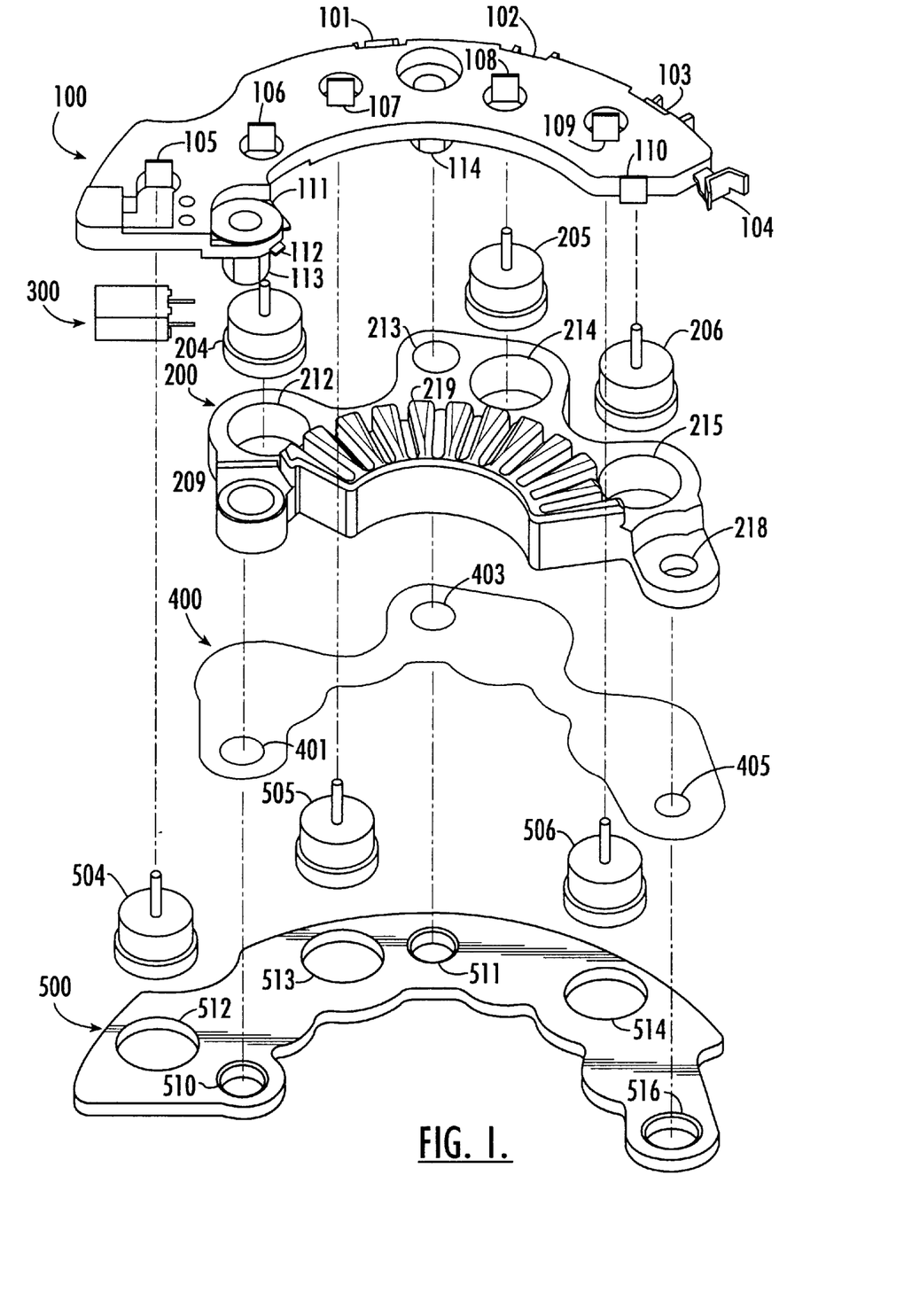
FIG. 1 is an exploded perspective view depicting each of the components of the rectifier assembly.

FIG. 1 depicts each of the components that constitute the rectifier assembly of the present invention. Each of the components are rotated 45 degrees toward the viewer from a plane projected at the eye level of the viewer. FIG. 1 depicts the following major sub-assemblies: preformed lead integument 100; insulating cooling member 200; capacitor 300; heat conductive electrical insulating gasket 400; and a thermal conductive plate 500.

Figure 6A:
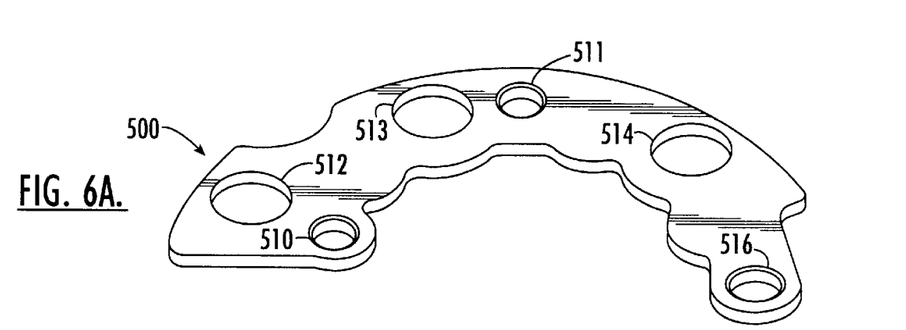
FIGS. 6A and 6B are perspective views of the thermo-conductive plate, the top view is as in FIG. 1, the bottom view is rotated 180 degrees to the right showing the detail of the counter-sunk holes to aid in pressing in the press-fit diodes.
Figure 6B:
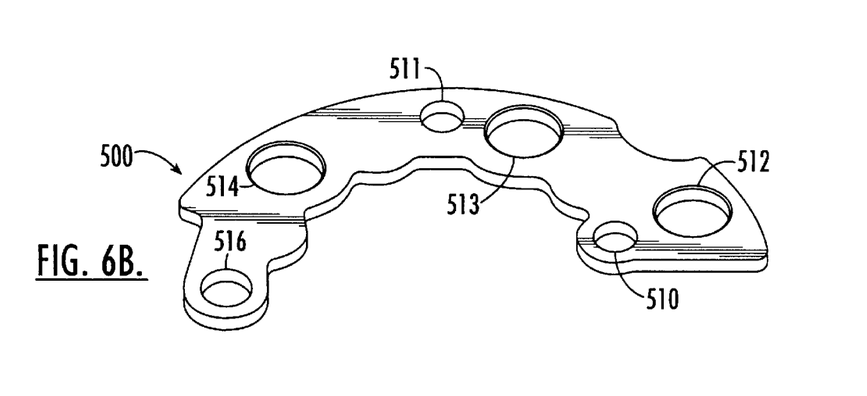

In FIG. 1, reference numeral 500 refers to a thermal conductive plate, which is also shown in the view of FIG. 6B. Thermal conductive plate 500 is of either aluminum or copper construction, and is dimensioned for mounting in direct contact with a generator. Holes 512, 513, 514 are sized to receive press-fit diodes 504, 505 and 506 in a metal displacement fashion to provide maximum electrical and heat conductivity to plate 500.

The lower contact area of diodes 504, 505 and 506 are pressed flush to the lower surface of plate 500 for additional electrical and heat conductivity to the generator. Holes 510 and 511 are clearance holes for the rectifier assembly to generator end frame attaching screws (not shown). Holes 510 and 511 receive integument 100 insulated standoffs 112 and 114 to provide perfect alignment for quick assembly and insulation to cooling member 200. Hole 516 is a clearance hole to permit non-conducting passage of an electrode bolt which makes contact with insulated cooling member 200 and hole 218. Joining press-fit diodes 504, 505 and 506 flush with lower surface of plate 500, by manual or semi-automatic means rapidly completes the final thermal conductive plate sub-assembly for reduced manufacturing costs.

Figure 4:
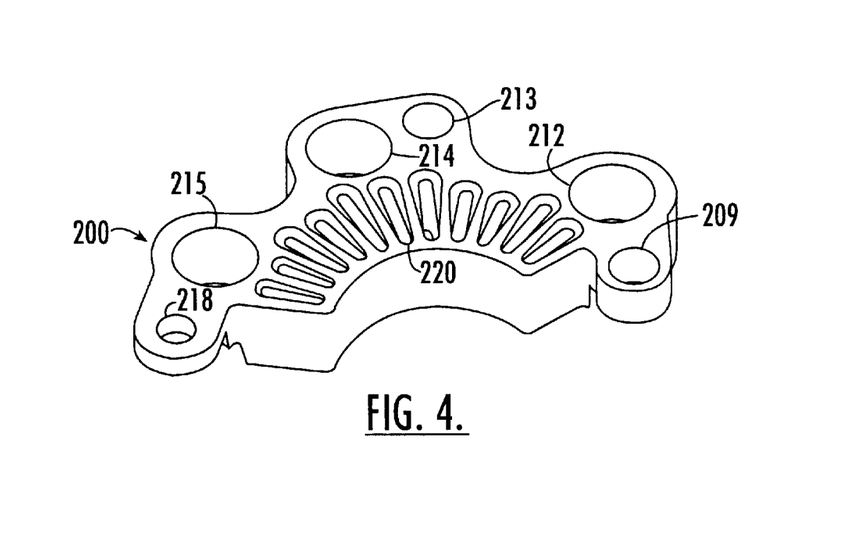
FIG. 4 is a perspective view of the insulated cooling member rotated 180 degrees to the right from the viewing plane of FIG. 1 showing the flat machined gasket contacting surface and the slots.

Casted insulated cooling member 200 of FIG. 1 is also shown in view of FIG. 4 and is fabricated with precast holes 209, 212, 213, 214, 215 and 218. The holes require only a quick clean up operation from a multiple reaming machine to provide precise diametric and relativistic dimensions. The only other machining operation is to provide a flat contacting surface as shown in FIG. 4. The casted member 200 is then tumbled in an abrasive compound to provide a near gloss finish to minimize the attraction of airborne particles and maximize airflow through a typical radii edge through slots as represented by 220 in FIG. 4. The extended fin 219 of FIG. 1 has radii edges to ease particle build-up and maximize air flow. The action of the radii on both sides of the slot creates a high pressure area on one side of the cooling member and a low pressure area on the other side over a greater surface area due to the radii edges resulting in a "ram" effect of air movement through the slot increasing the effective cooling capacity of the cooling member.

Holes 212, 214 and 215 receive press-fit diodes 204, 205 and 206 in a metal displacement manner similar to that described for plate 500 for the same advantages. The diodes are pressed flush with lower surface of cooling member 200 for additional thermal conductivity. Holes 209 and 213 provide passage for integument insulating standoffs 113 and 114 for rapid assembly alignment. Hole 218 is sized to provide a metal displacement contact with serrated section of bolt electrode again providing maximum electrical contact area. Joining press-fit diodes 204, 205 and 206 flush with lower surface of cooling member 200, by manual or semi-automatic means rapidly completes the final cooling member sub-assembly for reduced manufacturing costs.

Figure 2:
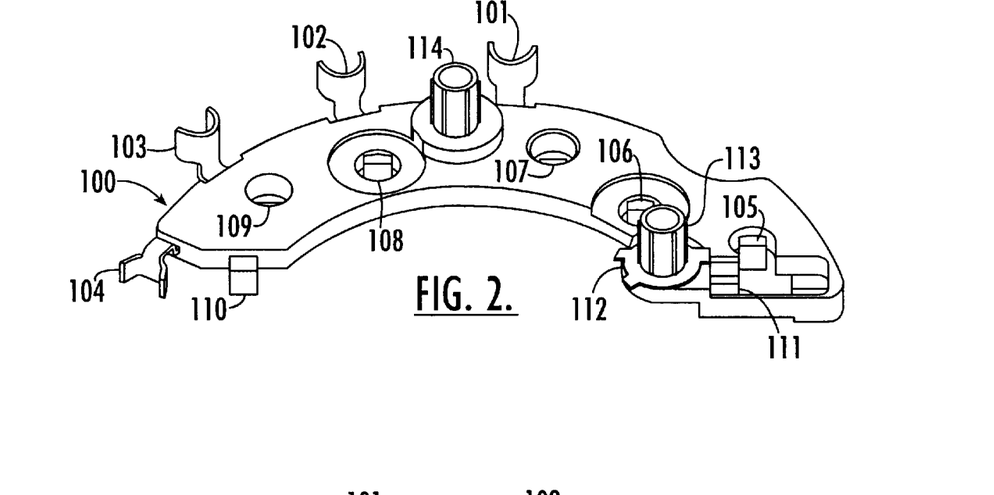
FIG. 2 is a perspective view of the integrated preformed lead integument rotated 180 degrees to the right from the viewing plane of FIG. 1, showing the detail of the insulating standoffs and the external terminating preformed conductors.
Figure 3:
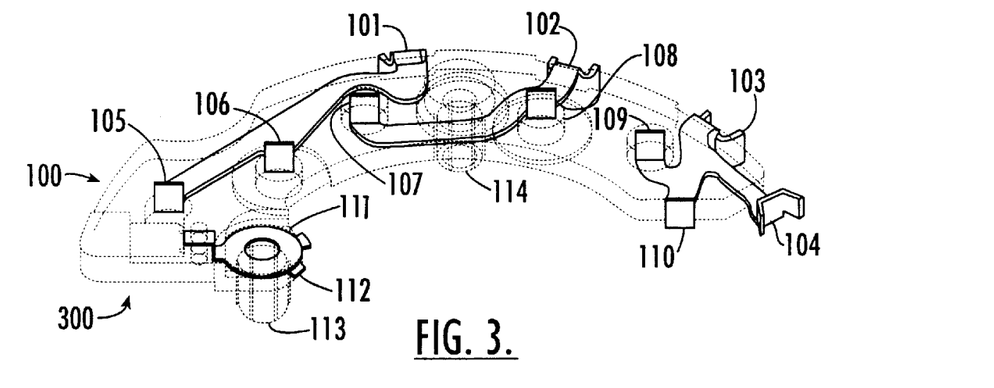
FIG. 3 is a perspective x-ray view of the integrated preformed lead integument depicting the detail of the embedded preformed conductors.

Integral preformed lead integument 100 of FIG. 1 is shown in bottom view in FIG. 2 and is moreover shown in the three dimensional phantom view in FIG. 3. Preformed conductive leads 101, 102, 103, 111 and 112 are of half hard copper construction with a suitable corrosion resistance electroplating and molded into the integument 100 in the fabrication process.

Referring to FIG. 2, crimp ends 103, 102 and 101 provide a means to connect to the generator stator leads (not shown). The height of the crimp ends 103, 102 and 101 is made taller so that the stator leads can be cut off an original defective rectifier, leaving ample contact area for a replacement rectifier assembly. Crimp end 104 provides attachment to a generator installed voltage regulator module (not shown).

With reference to FIG. 3, in the molding process, conductive leads 101, 102, 103, 111 and 112 are anchored firmly into the integument. Terminal tabs 105, 106, 107, 108, 109 and 110 are free to flex to provide thermal and mechanical stress relief. The terminal tabs are parallel to diode leads of diodes 204, 205, 206, 504, 505 and 506 to provide a flat accessible area for electro-welding the diode leads to said respective tabs.

Further reference to FIG. 3 reveals that the flat tabs of preformed embedded conductors 111 and 112 provide a means to electro-weld capacitor 300 leads to the respective tabs. Capacitor 300 is sized to fit snugly into a precast cavity in integument 100. A smaller cavity above the larger capacitor cavity allows space for an adhesive to firmly bond capacitor to integument 100. The embedded ring terminal portion of preformed conductor 111 makes electrical contact to a generator attachment screw (not shown) that effectively grounds on lead of capacitor 300. The ring terminal portion of preformed conductor 112 makes electrical contact to cooling member 200 that effectively connects the remaining lead of capacitor 300 from pressure provided by the attaching screw. The raised "ring" portion of the second cooling member aids in the electrical compression contact for the capacitor. Insulated standoff 113 fabricated into integument 100 provides both alignment for quick joining of the rectifier assembly sub-components and electrical insulation of the attaching screw (not shown) to the cooling member 200. Insulated standoff 114 fabricated into integument 100 provides alignment for quick joining of the rectifier assembly sub-components and electrical insulation of a second attaching screw (not shown) to the cooling member 200.

Figure 5A:
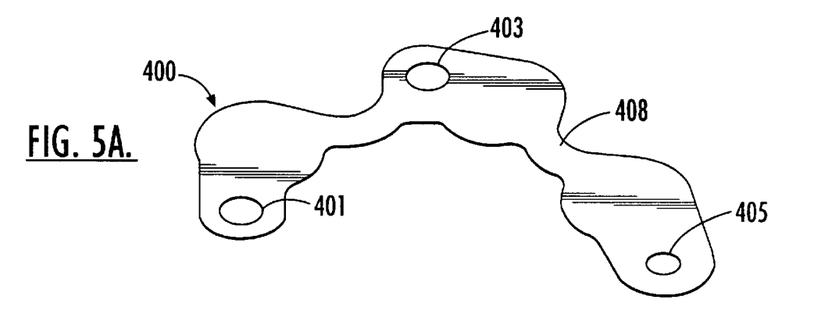
Figure 5B:
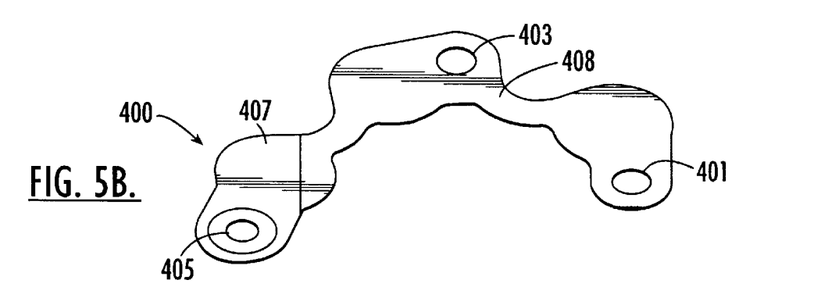

FIGS. 5A and 5B depict the heat conducting electrical insulating gasket 400 as also shown in FIG. 1. Referring to FIG. 5A, the top view shows the side of the gasket that makes contact with cooling member 200 (FIG. 1). This surface is of high heat conductive silicon embedded fabric. Further referring to FIG. 5B, the bottom view shows the opposite side of the gasket 400 that makes contact with thermal conductive plate 500 (FIG. 1). Surface area 408 in bottom view is identical to surface area 408 as shown in top view. Referring furthermore to the bottom view, surface area 407 consists of a thin layer of flexible phenolic that provides additional protection against piercing when gasket 400 is compressed between cooling member 200 and thermal conductive plate 500. Surface area phenolic layer 407 is embedded into gasket surface 408 in such a manner where surface area 407 is flush with surface area 408 to provide a uniform contact area. Referring to FIG. 1, hole 405 lines up with through hole 516 and battery electrode bolt can place considerable stress on the gasket 400 region, phenolic layer 407 absorbing this stress to prevent mechanical pierce through.

Figure 7:
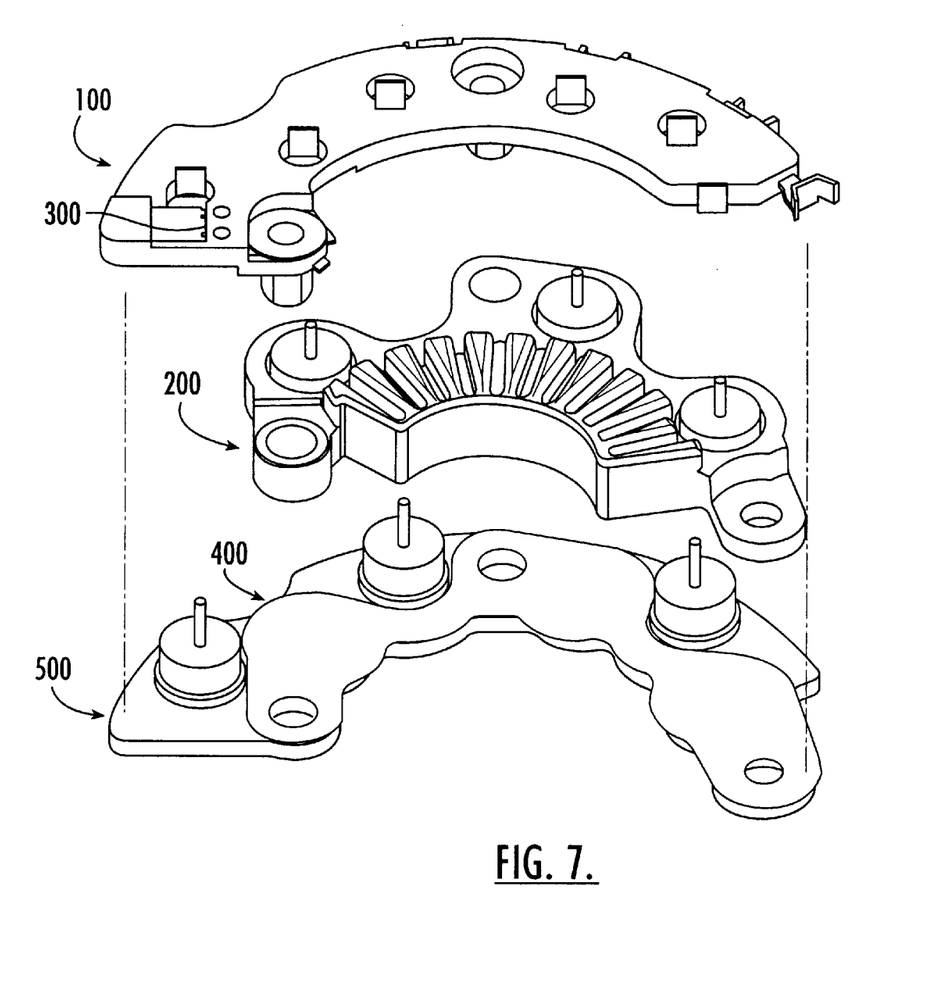
FIG. 7 is an exploded perspective view of the three sub-assemblies constituting the rectifier assembly.

FIG. 7 depicts the three sub-assemblies constituting the rectifier shown in arrangement prior to final assembly. From top to bottom, lead integument 100 is shown with capacitor 300 bonded into the cavity and assumes the two capacitor leads are electro-welded to the embedded ring terminals. The cooling member 200 is shown with the three diodes pressed in, with gasket 400 positioned on the plate. The gasket 400 may be coated on each side with a thermal conductive compound to further aid in heat transfer before it is positioned on thermal plate 500 as shown in FIG. 7.

Referring to FIG. 7, integument sub-assembly 100 is guided into cooling member 200, and then into thermal plate 500 with gasket 400 positioned where the alignment follows the centering lines as shown in FIG. 1. The six diode leads align with their six respective preformed tabs where each diode tab pair is electro-welded together to complete the final assembly.

Figure 8:
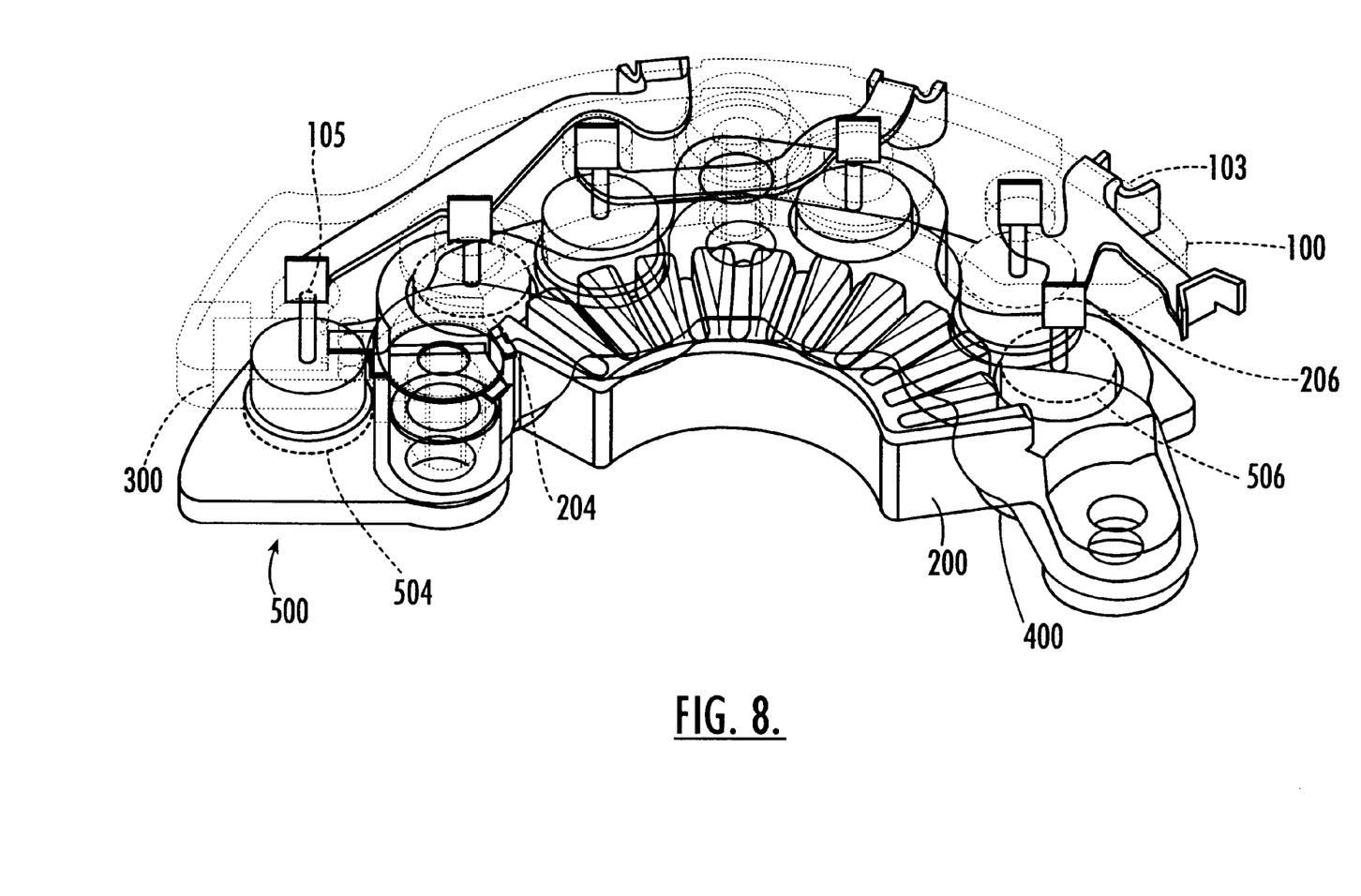
FIG. 8 is a perspective view in assembled configuration of the components of FIG. 1.

FIG. 8 is an "x-ray" format of the completed rectifier assembly, where all the sub-assembly components of FIG. 7 are shown in proper position. As a concluding assembly operation, the diode leads 204, 205, 206, 504, 506 and 506 of FIG. 1 are electro-welded to preformed conductive tabs 106, 108, 110, 105, 107 and 109 respectively.

Lab and vehicle tests of this rectifier assembly has shown that the rectifier assembly of the present invention is capable of beyond 10,000 full temperature range cycles without any detectable fatigue in the assembly joints. The described casted cooling member 200 with its aerodynamic fins permits far greater cooling capacity permitting greater overload currents without the destruction of the diode elements while also minimizing the overall component count. This also reduces manufacturing and assembly cost.

The action of the radii on both sides of the slot creates a high pressure area on one side of the cooling member and a low pressure area on the other side over a greater surface area due to the radii edges resulting in a "ram" effect of air movement through the slot. This increases the effective cooling capacity of the cooling member as opposed to the prior art methods where the equivalent slot has sharp perpendicular edges. The metal displacement assembly of the press-fit diodes avoids the use of fatigable solder in the diode chip or button diode methods of the prior art methods, while greatly decreasing the manufacturing assembly cost, thus providing a corrosion resistant seal.

The embedded conductive lead integument 100 provides a singular part that combines all of the rectifier assembly connective points and means for alignment of the final rectifier assembly as opposed to the cited prior art methods where several production operations dealing with a multitude of small individual components must be completed before the functional equivalent can be attached to their final rectifier assembly. This eliminates any possibility of assembly error and vastly reduces manufacturing cost with further benefit of providing a greater degree of ruggedness, minimizing the possibility of short circuits created by normal handling procedures.

The heat conductive electrical insulator 400 of embedded high stress localized area only phenolic combines both the advantages of maximum heat transfer due to high heat conductive silicon embedded mesh in low mechanical stress regions, and pierce protection in high mechanical stress regions as opposed to cited prior art methods. Only silicon mesh is used with poor mechanical strength or only phenolic is used for low heat conductivity.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A rectifier assembly comprising:
    a first electrically conductive cooling member having a first surface for direct contact mounting, and a second surface having a first set of diode mounting locations;
    a diode mounted within each diode mounting location of the first set, wherein each diode has a terminal extending generally normal from the first surface;
    an electrical insulator overlying the second surface of the first electrically conductive cooling member;
    a second electrically conductive cooling member having a first surface overlying the insulator and a second surface having a second set of diode mounting locations, said second electrically conductive cooling member having a plurality of slot openings formed in a radial pattern and extending through said second electrically conductive cooling member from the first surface to the second surface;
    a plurality of cooling fins extending upward beyond the second surface of the second electrically conductive cooling member adjacent the slot openings, wherein said slot openings and said cooling fins have formed radii edges such that a high pressure area is formed on one side of the cooling member and a low pressure area is formed on the other side to create a ram effect of air movement through the slot openings to effect enhanced cooling;
    a diode mounted within each diode mounting location of the second set, wherein each diode has a terminal extending generally normal from the first surface of the second electrically conductive cooling member; and
    a preformed lead layer formed as an integument mounted on the second electrically conductive cooling member and having conductive leads embedded therein that interconnect a diode of the first and second sets and a terminal for interconnecting with a corresponding lead of a vehicle.

2. A rectifier assembly according to claim 1, wherein each of said first and second electrically conductive cooling members are arcuately configured forming a curve, wherein said slot openings fan radially outward along lines defined from a center point of the curve.

3. A rectifier assembly according to claim 1, wherein said electrical insulator comprises an electrical insulating gasket having opposing surfaces formed of high heat conductive silicon embedded fabric.

4. A rectifier assembly according to claim 3, wherein said electrical insulator surface positioned against said first conductive cooling member comprises a phenolic layer embedded within said gasket to aid in absorbing stress.

5. A rectifier assembly according to claim 1, wherein said preformed lead layer includes opposing ends, a capacitor cavity formed within one of said ends, and a capacitor mounted within said capacitor cavity and interconnecting with at least one of said conductive leads embedded therein.

6. A rectifier assembly according to claim 5, wherein said capacitor is adhesively bonded within said capacitor cavity.

7. A rectifier assembly according to claim 1, wherein said diode mounting locations on said first electrically conductive cooling member are formed as holes passing through said first electrically conductive cooling member and dimensioned to receive diodes of the first set in an interference fit.

8. A rectifier assembly according to claim 7, wherein said diodes of the first set have surfaces that are flush to the first surface of the first electrically conductive cooling member for direct contact with a surface on which the first electrically conductive cooling member is mounted.

9. A rectifier assembly according to claim 1, wherein said second set of diode mounting locations on said second electrically conductive cooling member are formed as holes passing through said first electrically conductive cooling member and dimensioned to receive diodes of the second set in an interference fit.

10. A rectifier assembly according to claim 1, wherein said diodes of the first set have surfaces that are flush to the first surface of the second electrically conductive cooling member for direct contact to the electrical insulator.

11. A rectifier assembly according to claim 1, and further comprising insulated standoffs for aligning the preformed lead layer with the first electrically conductive cooling member, the second electrically conductive cooling member and electrical insulator to aid in rapid assembly.

12. A rectifier assembly for use with an engine-driven generator comprising:

a first electrically conductive cooling member having a substantially planar first surface for direct contact mounting on the generator, and a second substantially planar surface having a first set of diode mounting locations;

a diode mounted within each diode mounting location of the first set, wherein each diode has a terminal extending generally normal from the first surface;

an electrical insulator overlying the second surface of the first electrically conductive cooling member;

a second electrically conductive cooling member having a first surface overlying the insulator and a second surface having a second set of diode mounting locations, said second electrically conductive cooling member having a fan shaped set of slot openings extending through said second electrically conductive cooling member from the first surface to the second surface;

a plurality of cooling fins extending upward beyond the second surface of the second electrically conductive cooling member adjacent the slot openings, wherein said slot openings and said cooling fins have a formed radii edges such that a high pressure area is formed on one side of the cooling member and a low pressure area is formed on the other side to create a ram effect of air movement through the slot openings to effect enhanced cooling;

a diode mounted within each diode mounting location of the second set, wherein each diode has a terminal extending generally normal from the first surface of the second electrically conductive cooling member; and a preformed lead layer formed as an integument mounted on the second electrically conductive cooling member and having conductive leads embedded therein that interconnect a diode of the first and second sets, and a terminal for interconnecting with a corresponding lead of a vehicle.

13. A rectifier assembly according to claim 12, wherein each of said first and second electrically conductive cooling members are arcuately configured forming a curve, wherein said slot openings fan radially outward along lines defined from a center point of the curve.

14. A rectifier assembly according to claim 12, wherein said electrical insulator comprises an electrical insulating gasket having opposing surfaces formed of high heat conductive silicon embedded fabric.

15. A rectifier assembly according to claim 14, wherein said electrical insulator surface positioned against said first conductive cooling member comprises a phenolic layer embedded within said gasket to aid in absorbing stress.

16. A rectifier assembly according to claim 14, wherein said preformed lead layer includes opposing ends, a capacitor cavity formed within one of said ends, and a capacitor mounted within said capacitor cavity and interconnecting with at least one of said conductive leads.

17. A rectifier assembly according to claim 14, wherein said capacitor is adhesively bonded within said capacitor cavity.

18. A rectifier assembly according to claim 14, wherein said diode mounting locations on said first electrically conductive cooling member are formed as holes passing through said first electrically conductive cooling member and dimensioned to receive diodes of the first set in an interference fit.

19. A rectifier assembly according to claim 18, wherein said diodes of the first set have surfaces that are flush to the first surface of the first electrically conductive cooling member for direct contact to the electrical insulator.

20. A rectifier assembly according to claim 14, wherein said second set of diode mounting locations on said second electrically conductive cooling member are formed as holes passing through said first electrically conductive cooling member and dimensioned to receive diodes of the second set in an interference fit.

21. A rectifier assembly according to claim 20, wherein said diodes of the first set have surfaces that are flush to the first surface of the second electrically conductive cooling member for direct contact with the second surface of the first electrically conductive cooling member.

22. A rectifier assembly according to claim 14, and further comprising insulated standoffs for aligning the preformed lead layer with the first electrically conductive cooling member, the second electrically conductive cooling member and electrical insulator to aid in rapid assembly.

* * * * *

UNITED STATES PATENT AND TRADEMARK OFFICE
CERTIFICATE OF CORRECTION

PATENT NO. : 5,991,184
DATED      : Nov. 23, 1999
INVENTOR(S) : Russell et al

It is certified that error appears in the above-identified patent and that said Letters Patent is hereby corrected as shown below:

Column 1, line 35:    Delete:
                                       "5,696,212"

Substitute:
                                      -- 5,659,212 --

Column 1, line 53:    Delete:
                                       "4,646,838"

Substitute:
                                      -- 5,646,838 --

Signed and Sealed this

Twenty-third Day of May, 2000

*Attest:*

Q. TODD DICKINSON

*Attesting Officer*                      *Director of Patents and Trademarks*